United States Patent [19]
Chang

[11] Patent Number: 5,153,380
[45] Date of Patent: Oct. 6, 1992

[54] WAVE SEPARATOR HOUSING STRUCTURE

[76] Inventor: Chia-Shine Chang, No. 35, Ching Shin Road, Pi Tou Village, She Tou Shiang, Changhua, Taiwan

[21] Appl. No.: 713,085

[22] Filed: Jun. 11, 1991

[51] Int. Cl.$^5$ ............................................. H05K 5/00
[52] U.S. Cl. ..................................... 174/52.1; 174/50
[58] Field of Search ................... 174/50, 52.1, 59, 60; 361/356; 220/3.2, 4.02, 682

[56] References Cited

U.S. PATENT DOCUMENTS

| | | | |
|---|---|---|---|
| 4,015,070 | 3/1977 | Theurer | 174/52.1 |
| 4,091,232 | 5/1978 | Lenk et al. | 174/52.1 |
| 4,249,035 | 2/1981 | Watley | 174/52.1 |
| 4,424,404 | 1/1984 | Moore et al. | 174/52.1 |
| 4,845,447 | 7/1989 | Holdsworth | 333/167 |

Primary Examiner—Leo P. Picard
Assistant Examiner—Bot Lee Ledynh
Attorney, Agent, or Firm—Bacon & Thomas

[57] ABSTRACT

A housing for a wave separator, comprising a casing, which has an opening at the top, an input port connector and a plurality of output port connectors respectively made at two opposite sides and integrally formed through molding process, and a covered board covered on said casing to close up said opening, wherein the casing has a stepped top edge comprised of a first step edge disposed at the inside at a lower position, a third step edge disposed at the topmost position, a second step edge disposed at the inside between the first and third step edges, and a V-groove defined between the second and third step edges, the first step edge having a tapered projection tightly engaged into the cover board at the bottom, the second step edge having a side wall portion peripherally engaged with the cover board and an upper part bent inwards to firmly retain the cover board around the periphery thereof.

1 Claim, 3 Drawing Sheets

WAVE SEPARATOR HOUSING STRUCTURE

BACKGROUND OF THE INVENTION

1. Field of the Invention

The present invention relates to a housing for a wave separator and relates more particularly to such a housing for a wave separator which has a stepped top edge at the top around the top opening thereof for holding a top cover tightly in position to close up said top opening.

2. Description of the Prior Art

Wave separator is an electronic device generally provided with a branching filter for wave separating and distributing purpose. The branching filter must be tightly enclosed inside the housing of a wave separator so as to eliminate from interference of outside noises. FIGS. 1 and 2 illustrate a housing for a wave separator according to the prior art. The housing is generally comprised of a casing which has an endless groove around the top edge thereof, and a cover which has three endless projections around the periphery thereof with one inside another. Inserting the middle endless projection into the endless groove causes the top edge of the casing to be retained by the two outer endless projections. After mounting, the gap between the cover and the casing is sealed by glue. One disadvantage of this wave separator housing structure is that the cover is complicated and expensive to manufacture. Another disadvantage of this wave separator housing structure is that the cover may be disconnected from the casing easily to affect the service life of a wave separator.

SUMMARY OF THE INVENTION

The present invention has been accomplished to eliminate the aforesaid problems. It is therefore an object of the present invention to provide a wave separator housing structure which has means to tightly retain the cover board thereof in place once it is attached thereto to close up the top opening thereof.

It is another object of the present invention to provide a wave separator housing structure which is simple in structure and inexpensive to manufacture.

BRIEF DESCRIPTION OF THE DRAWINGS

The foregoing and other objects, features and advantages of the present invention will be best understood from the following description, the appended claims and the accompanying drawings in which:

DETAILED DESCRIPTION OF THE PREFERRED EMBODIMENT

Figure 3:
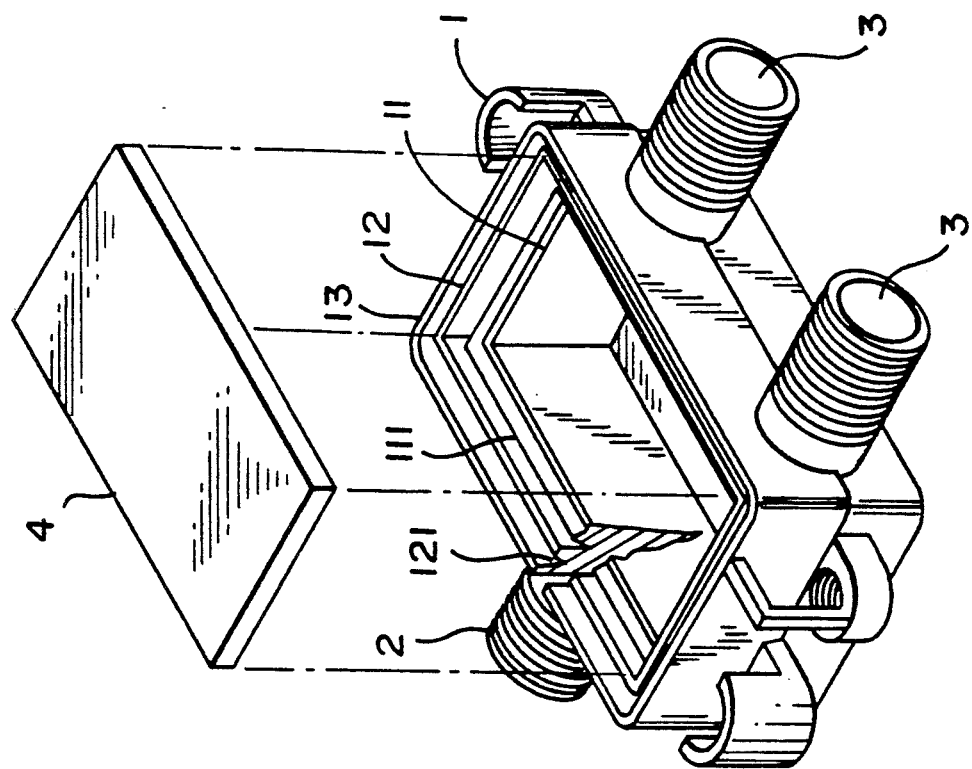
FIG. 3 is a dismantled perspective view of the preferred embodiment of the housing of the present invention.

Referring to FIG. 3, therein illustrated is the preferred embodiment of the present invention which is generally comprised of a casing 1 having an input port connector 2 and a plurality of output port connectors 3 respectively made thereon at suitable locations, and a cover board 4 mounted on said casing 1 to completely close up the top opening thereof, wherein said casing 1, said input port connector 2 and said output port connectors 3 are made into an integral unit by the process of molding. The casing 1 is a rectangular cabinet having a stepped top edge around the top opening thereof for fastening the cover board 4, which stepped top edge is comprised of a first step edge 11 internally disposed at a lower position, a third step edge 13 at the topmost position and a second step edge 12 internally disposed therebetween. Further, there is a tapered projection 111 projecting upwards from the first step edge 11, and a V-groove 121 formed between the second and third step edges 12 and 13. The cover board 4 is a solid plate with six faces provided for covering the top opening of the casing 1 tightly.

Figure 2A:
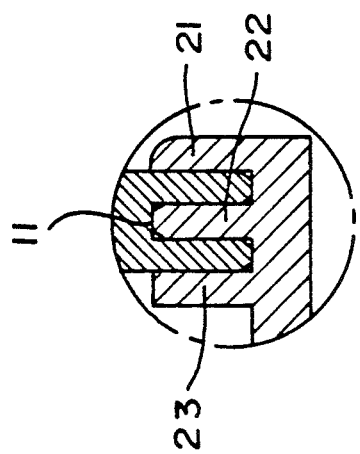
FIG. 2 is a sectional assembly view of the housing in FIG. 1.
Figure 2:
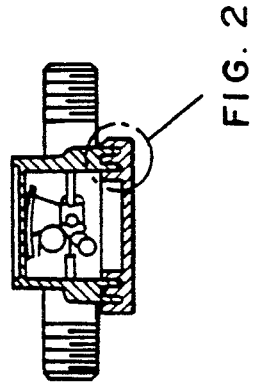
Figure 1:
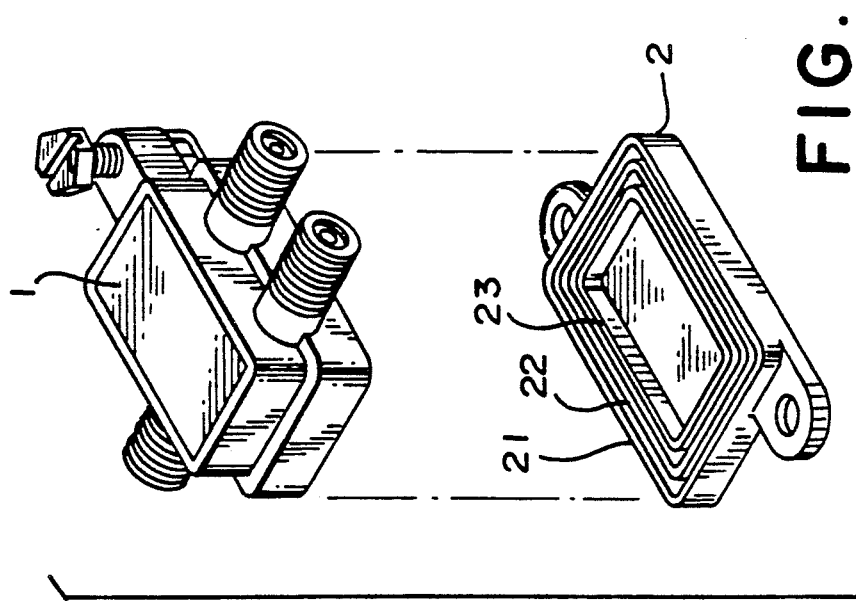
FIG. 1 is a dismantled perspective view of a housing for a wave separator according to the prior art.
Figure 5:
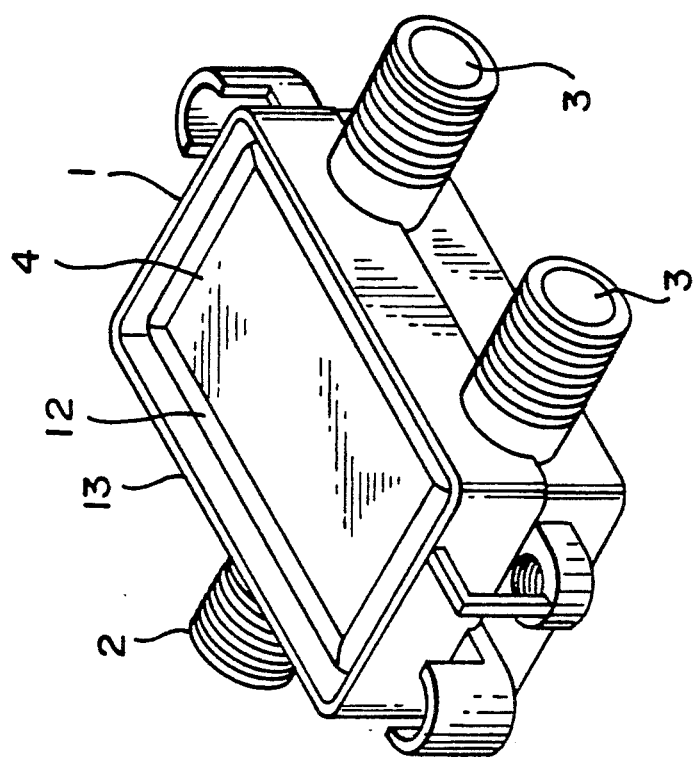
FIG. 5 is a perspective assembly view of the preferred embodiment of the housing of the present invention.
Figure 4A:
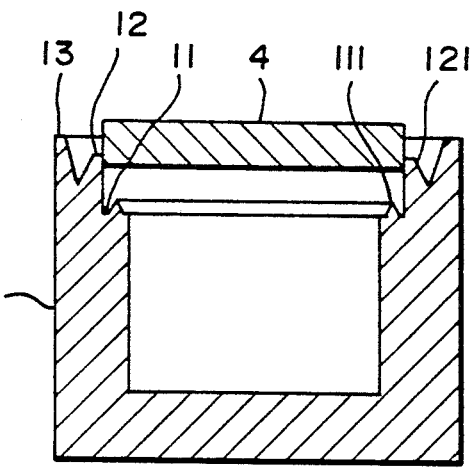
FIGS. 4-A, 4-B and 4-C are assembly process drawings according to the present invention.
Figure 4B:
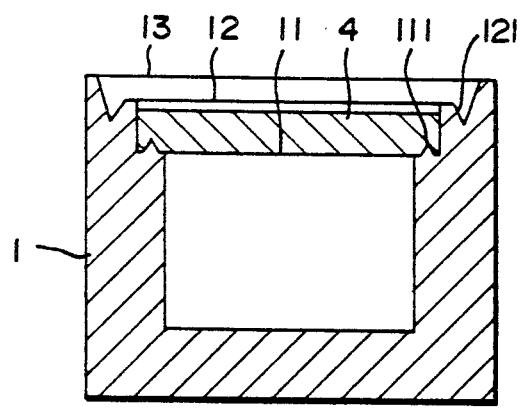
Figure 4C:
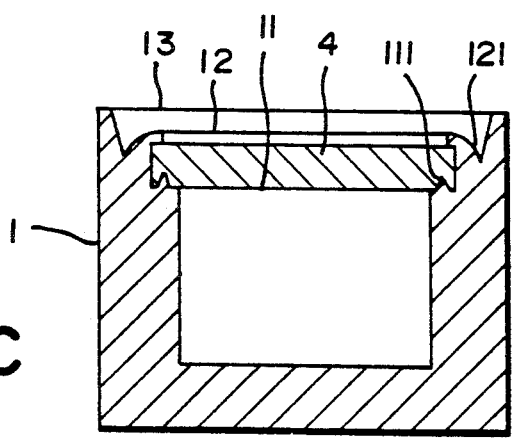

Referring to FIGS. 4-A, 4-B, 4-C and FIG. 5, the cover board 4 is made in size tightly matching the periphery of the seconds step edge 12 (as shown in FIG. 4-A). When the cover board 4 is tightly pressed down, the tapered projection 111 is forced to engage in the bottom edge of the cover board 4 (as shown in FIG. 4-B). Then, the projecting part of the second step edge 12 over the top edge of the cover board 4 is bent inwards to retain the top edge of the cover board 4 around the periphery thereof (as shown in FIG. 4-C). After through the aforesaid assembly process, the cover board 4 becomes firmly retained to the casing 1 at the top to tightly cover the top opening thereof (as shown in FIG. 5).

I claim:

1. For a wave receptor, a housing comprising a casing, which is a rectangular cabinet having an opening at the top, an input port connector and a plurality of output port connectors respectively made at two opposite sides and integrally formed through molding process, and a cover board covered on said casing to close up said opening, and characterized in that said casing has a stepped top edge comprised of a first step edge disposed at the inside at a lower position, a third step edge disposed at the topmost position, a second step edge disposed at the inside between said first and third step edges, and a V-groove defined between said second and third step edges, said first step edge having a tapered projection tightly engaged into said cover board at the bottom, said second step edge having a side wall portion peripherally engaged with said cover board and an upper part bent inwards to firmly retain said cover board around the periphery thereof.

* * * * *